United States Patent [19]

Graul et al.

[11] 4,216,030
[45] Aug. 5, 1980

[54] PROCESS FOR THE PRODUCTION OF A SEMICONDUCTOR COMPONENT WITH AT LEAST TWO ZONES WHICH FORM A PN-JUNCTION AND POSSESS DIFFERING CONDUCTIVITY TYPES

[75] Inventors: Juergen Graul, Gruenwald; Helmut Müeller, Fuerstenfeldbruck, both of Fed. Rep. of Germany

[73] Assignee: Siemens Aktiengesellschaft, Berlin & Munich, Fed. Rep. of Germany

[21] Appl. No.: 969,096

[22] Filed: Dec. 13, 1978

Related U.S. Application Data

[62] Division of Ser. No. 798,799, May 20, 1977, abandoned.

[30] Foreign Application Priority Data

Jun. 22, 1976 [DE] Fed. Rep. of Germany ....... 2627855

[51] Int. Cl.² .................... H01L 21/265; H01L 21/26
[52] U.S. Cl. ...................................... 148/1.5; 357/13; 357/20; 357/91
[58] Field of Search .................... 148/1.5; 357/91, 13, 357/20

[56] References Cited

U.S. PATENT DOCUMENTS

| | | | |
|---|---|---|---|
| 3,900,345 | 8/1975 | Lesk ........................... | 148/1.5 |
| 3,925,106 | 12/1975 | Ku et al. ..................... | 148/1.5 |
| 4,056,408 | 11/1977 | Bartko et al. ................ | 148/1.5 |
| 4,063,967 | 12/1977 | Graul et al. .................. | 148/1.5 |
| 4,081,292 | 3/1978 | Aoki et al. ................... | 148/1.5 |

OTHER PUBLICATIONS

Payne et al., "Fully Ion-Implanted – Transistors" IEEE-Trans. Electron Devices, Ed-21, (1974) 273.
Hofker et al., ". . . B Implantations in Amorphous . . . Si", Rad. Effects, 24 (1975) 223.
Csepregi et al., ". . . Residual Disorder in . . . Si", Rad. Effects, 28 (1976) 227.
Crowder et al., ". . . B Atn . . . in Ion-Implanted Si", Ion Implantation in S/C . . . Ed. Crowder, Plenum, N.Y., 1972, p. 257.
Ryssel et al., "B Doping . . . Amorphous . . . Si . . . Ion-Implantation in S/C . . . " Ed. Crowder, Plenum, N.Y., 1972, p. 215.
Stephen et al., ". . . Ion-Implanted . . . PN Junctions" Rad. Effects, 1 (1971) 73.
Bhatia et al., "Isolation Process . . . " IBM-TDB, 19 (1977) 4171.
Bauer, ". . . B-Implanted Layers in Si . . . "Appl. Phys. Letters, 20 (1972) 107.

*Primary Examiner*—L. Dewayne Rutledge
*Assistant Examiner*—Upendra Roy
*Attorney, Agent, or Firm*—Hill, Van Santen, Steadman, Chiara & Simpson

[57] ABSTRACT

A semiconductor component is described which includes two zones of opposite conductivity type having a pn junction therebetween, and in which one zone is formed of a monocrystalline semiconductor substrate body and the other zone is produced in the semiconductor body by a doping process, such, for example, as by an implantation or diffusing process. Before the diffusion or implantation takes place, a zone is created at or near the substrate surface which has a disturbed crystal lattice. The diffusion or implantation then takes place through the disturbed zone. A process for producing such a semiconductor component is also described.

The other zone may also be produced after the disturbed crystal lattice is produced in the portion of the substrate body which portion will later become the second zone.

17 Claims, 4 Drawing Figures

PROCESS FOR THE PRODUCTION OF A SEMICONDUCTOR COMPONENT WITH AT LEAST TWO ZONES WHICH FORM A PN-JUNCTION AND POSSESS DIFFERING CONDUCTIVITY TYPES

This is a division of application Ser. No. 798,799, filed May 20, 1977, now abandoned.

INTRODUCTION

The present invention relates to a semiconductor component with at least two zones which form a pn-junction and possess differing conductivity type, in which the one zone is formed by a monocrystalline semiconductor substrate body, and the other zone is produced in the semiconductor substrate body by a doping process, for example, an implantation or diffusion process. The invention further relates to a process for the production of a semiconductor component of this type.

BACKGROUND OF THE INVENTION

For example, in double diffused silicon planar transistors having an emitter produced by phosphorus diffusion, in the base zone beneath the emitter there occurs the so-called emitter-dip effect which impedes a check on base width and current amplification and which increases the inner base bulk resistance. In addition, the emitter efficiency is well below the expected theoretical value based on the doping. When arsenic is used for the emitter doping, although generally no emitter-dip effect occurs, here too the theoretical values of the emitter efficiency are nowhere near reached.

Both effects have their origin in the conventionally high surface concentration in the emitter due to the production of crystal faults on the one hand and increased recombination of the minority carriers and reduction in the effective emitter doping due to the reduction in the band spacing on the other hand.

The so-called polysil emitter has already become known as a possible way to avoid these disadvantages. The technology which forms the basis of this principle consists in screening the silicon monocrystal from the harmfully high concentration in the production of the emitter. To this end, on the completion of the conventional planar processes, including the base diffusion, the emitter window is opened in the surface oxide and then a thin layer of polycrystalline, undoped silicon is deposited by conventional processes. Then, for example, phosphorus is diffused into the monocrystal through the polycrystalline silicon layer. A disturbingly high doping concentration then occurs on the surface of the polycrystalline silicon layer, and it is possible to set the concentration of the doping in the monocrystal in accordance with the diffusion time.

Transistors produced in this way exhibit no emitter-dip effect with high current amplification. The penetration depth is extremely small, and the layer resistance of the base beneath the emitter is only slightly increased. However, with this polysil technology, a strong influence of the polysilicon deposition parameters and the boundary properties between polysil layer and monocrystal on the electrical transistor data can be observed.

The aim of the present invention is to avoid the disadvantages resulting from the above mentioned conditions, while simultaneously improving the transistor properties.

BRIEF SUMMARY OF THE INVENTION

The above disadvantages of the prior art are overcome in accordance with the present invention in that the zone produced by a doping process contains a region which has a disturbed lattice structure.

In a further development of the invention, the region having a disturbed lattice structure can be at least partially annealed.

In a further development of the invention, in a process for the production of a semiconductor component of this type, there is a process herein disclosed in which a monocrystalline semiconductor substrate body of the one conductivity type has a region having a lattice structure produced locally which is disturbed. That part of the semiconductor substrate body which contains the region having the disturbed lattice structure is used for the formation of a zone of the other conductivity type considered spatially redoped in such a manner that the pn-junction which is thus formed, with respect to the region which is disturbed in its lattice structure, lies deeper inside the semiconductor substrate body and therefore surrounds the lattice at a distance.

Furthermore, the region which is disturbed in its lattice structure can be thermally treated during or following the doping process for the purpose of obtaining at least partial recrystallization.

BRIEF DESCRIPTION OF THE DRAWINGS

In the following, the invention will be explained in detail making reference to exemplary embodiments which are illustrated in the Figures of the drawing, in which.

DESCRIPTION OF THE PREFERRED EMBODIMENTS

Figure 1:
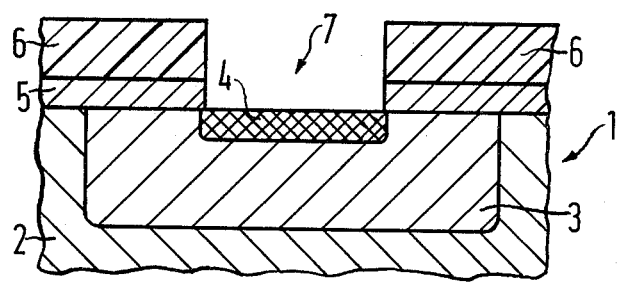
FIG. 1 is a schematic illustration of a transistor structure following the production of a region having a disturbed lattice structure and prior to a doping process for the production of an emitter.

FIG. 1 schematically illustrates a semiconductor substrate body 1 in the form of a planar transistor structure with a collector zone 2 and a base zone 3. Arranged on the surface of this substrate body 1, in the conventional way, is an oxide layer 5. Where the substrate body consists of silicon, layer 5 may be a silicon dioxide layer. This oxide layer 5 can itself be covered by a photo-resist layer 6. A window 7 is provided in the two layers 5 and 6 in the conventional manner in order to produce an emitter.

In accordance with the invention, a region 4 having a disturbed lattice structure is now produced in the semiconductor substrate body 1, which possesses a monocrystalline lattice structure. Where the component is to be a transistor 20 would be the emitter, 3 would be the base and 2 would be the collector. The lattice disturbance zone 4 here is produced by particles of suitable energy and mass (implantation) on the basis of beam damage directly in the monocrystal.

Preferably ions of the host lattice, i.e., ions of the material of the semiconductor substrate body 1 may be used to produce this zone having a disturbed lattice structure. If, as mentioned above, the semiconductor substrate body 1 consists of silicon, the implanted ions will preferably be silicon ions. However, the implantation can also be carried out with particles which differ from the material of the semiconductor substrate body, such as protons, oxygen ions or inert gas ions.

It is not absolutely required that the region 4 which has a disturbed lattice structure adjoin the surface of the semiconductor substrate body 1, as illustrated in FIG. 1. As will be further explained with reference to the diagram in FIG. 4, the region 4, having a disturbed lattice structure, can also lie at a specific distance beneath the surface of the semiconductor substrate body 1 inside the latter. The two aforementioned designations of the location of the region 4 which has a disturbed lattice structure can be obtained as a function of the particle type and energy used in the implantation. The distance of the region 4 having a disturbed lattice structure from the surface of the semiconductor substrate 1 can, for example, amount to 1 $\mu$m. The lateral extent of the region 4 having a disturbed lattice structure is determined by the size of the openings in the masking layers 5 and 6.

It should be mentioned that the region 4 which has a disturbed lattice structure can also be produced through covering layers, such as e.g. oxides or nitrides.

The described measures can also be applied to other materials as well as silicon.

In a practical exemplary embodiment, the region 4 having a disturbed lattice structure is produced close to the surface by means of silicon implantation using an energy of a maximum of 300 keV and a dose of between $10^{14}$ and $10^{17}$ cm$^{-2}$. If the thickness of the oxide layer 5 is simply to suffice for masking purposes, the photoresist layer can be removed before the implantation.

Figure 2:
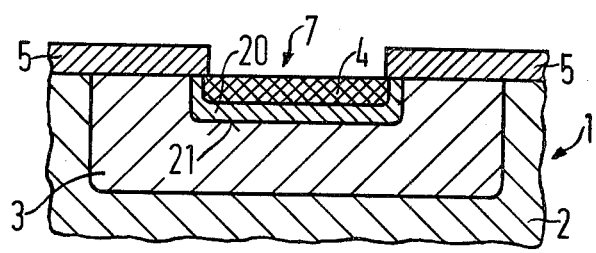
FIG. 2 illustrates the structure corresponding to FIG. 1 following the production of the emitter.

Following the production of the region 4 which has a disturbed lattice structure, an emitter zone 20 is produced in the semiconductor substrate body 1 by means of a doping process. As illustrated in FIG. 2, in this emitter zone, identical elements to those in FIG. 1 have been provided with like references.

The doping of the region 4 having a disturbed lattice structure can basically be achieved by diffusion, implantation or by combining both processes, and by means of a temperature process. At least partial annealing will then occur by recrystallization in the region 4 which has the damaged lattice structure.

When doping is carried out by diffusion it is possible to proceed in accordance with known methods. It is expedient to split the diffusion process into a predeposition and a subsequent drive-in, in order to set the position of the pn-junction between emitter 20 and base 21. The diffusion process is carried out through the region 4 which has a disturbed lattice structure in such a manner that the pn-junction 21 is formed in a zone having an undisturbed crystal structure. Generally, the pn-junction 21 is arranged at a distance of a few 100 to a few 1000 Å behind the region 4. The predeposition can be carried out prior to or following the production of the region 4.

The process can be used both for n-diffusion e.g. with phosphorus and also for p-diffusion e.g. with boron.

As mentioned above, the region 4 which has a disturbed lattice structure can extend to the semiconductor surface or can lie inside the semiconductor substrate body 1.

Figure 3:
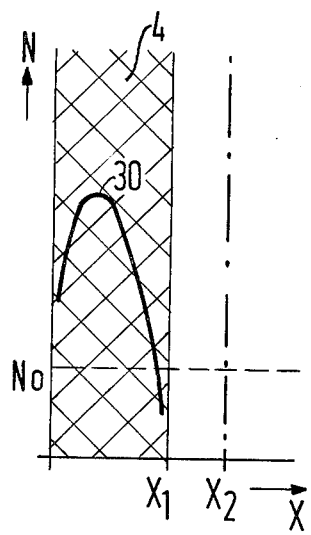
FIG. 3 is a diagram of the doping concentration as a function of the depth in a semiconductor structure corresponding to FIGS. 1 and 2, with a region close to the surface having a disturbed lattice structure.
Figure 4:
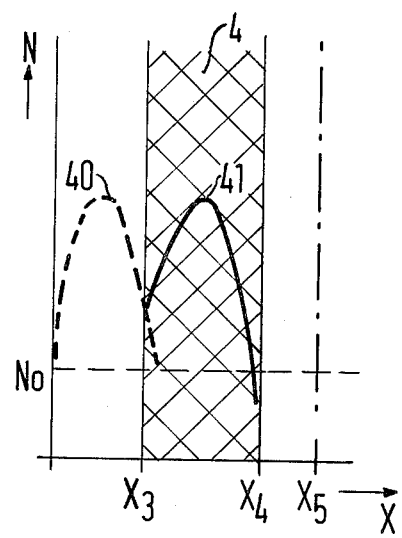
FIG. 4 is a diagram of the doping concentration as a function of the depth in a semiconductor structure corresponding to FIGS. 1 and 2 with a region which lies beneath the surface and possesses a disturbed lattice structure.

These conditions are illustrated in FIGS. 3 and 4, in which the doping concentration N is in each case plotted as a function of the depth x in the semiconductor substrate body. In FIGS. 1 and 2, the x-direction is in each case that direction which runs vertically downwards in the drawing plane, where the zero point in each case lies in the semiconductor surface. In accordance with FIG. 3, that disturbed lattice region is shown in cross-shading and lies on the semiconductor surface and extends to a depth of $x_1$ into the semiconductor substrate body 1. A dash-dotted vertical line indicates that the pn-junction 21 is to lie at a depth $x_2$. The horizontal line $N_0$ indicates the basic doping of the semiconductor substrate body 1 or of a corresponding doping profile.

When the emitter zone 20 is produced by implantation doping, the implantation energy is selected to be such that the maximum of the implantation profile represented by a curve 30 lies within the region 4. In a temperature process which follows the implantation, the doping atoms diffuse out of the region 4 which has a damaged lattice structure into the monocrystal, so that the complete pn-junction lies at a depth $x_2$, i.e., the pn-junction 21 surrounds at a distance the region 4 which possessed an originally disturbed structure, but which, however, as a result of the temperature treatment may have been partially recrystallized and thus partially healed. The aforementioned distance can, as mentioned above, amount to a few 100 to a few 1000 Å.

FIG. 4 illustrates the situation in which the region 4 which has a disturbed lattice structure lies beneath the surface inside the semiconductor substrate body 1. Its dimensions are governed by the depth values $x_3$ and $x_4$. The theoretical depth of the finished pn-junction 21 has a value $x_5$. For this situation the maximum of the implanted distribution can lie either in the region 4 (solid line curve 41) or in the crystal region in front of the disturbed region 4 (broken line curve 40). Here again, the implantation is followed by a temperature treatment so that the doping atoms diffuse out of the region 4 or through the region 4 into the monocrystal, so that the pn-junction 21 is formed at a depth $x_5$. (The corresponding also applies to that part which is close to the surface, i.e., the pn-junction between the region 4 and the surface.)

In the event of doping with arsenic, the implantation is achieved, for example, at any energy of less than 300 keV, and with a dose of between $1 \cdot 10^{13}$ and $1 \cdot 10^{17}$ cm$^{-2}$. The maxima of the implantation profile here can be formed in the manner explained making reference to FIGS. 3 and 4.

During a following diffusion step carried out, for example, for 30 minutes at 1000° C., the implanted arsenic diffuses out, by which means the pn-junction 21 is produced. Simultaneously to this temperature process, a recrystallization and thus a partial annealing of the emitter structure of the region 4 can occur.

It will be apparent to those skilled in the art that many modifications and variations may be effected without departing from the spirit and scope of the novel concepts of the present invention.

We claim as our invention:
1. A process for the production of a semiconductor component which includes taking a monocrystalline semiconductor substrate of one conductivity type, creating a local region therein having a disturbed crystal lattice, forming in that part of said semiconductor substrate which contains the region having a disturbed lattice structure a zone of the other conductivity type considered spatially redoped in such a manner that the pn-junction thus formed lies deeper inside the semiconductor substrate body than the region which is disturbed in its lattice structure and thus surrounds the latter at a distance.

2. A process as claimed in claim 1, in which the region which is disturbed in its lattice structure is treated thermally during the redoping process in order to achieve an at least partial healing by recrystallization during the redoping process.

3. A process as claimed in claim 1, in which the region which is disturbed in its lattice structure is treated thermally during the redoping process in order to achieve an at least partial healing by recrystallization following the redoping process.

4. A process as claimed in claim 1, in which the region which is disturbed in its lattice structure is produced by implantation.

5. A process as claimed in claim 1, in which the redoping which is provided in order to form a zone of the other conductivity type is effected by diffusion.

6. A process as claimed in claim 1, in which the redoping which is provided in order to form a zone of the other conductivity type is carried out by implantation with a subsequent temperature treatment.

7. A process as claimed in claim 1, in which the implantation for the doping of the semiconductor substrate is carried out prior to the formation of the disturbed lattice region.

8. A process as claimed in claim 1, in which the implantation for the doping of the semiconductor substrate body is carried out following the production of the region which is disturbed in its lattice structure.

9. A process as claimed in claim 1, in which the redoping for the formation of a zone of the other conductivity type first comprises a preliminary step in which a doping profile is produced whose maximum lies in the region having a disturbed lattice structure.

10. A process as claimed in claim 4, in which the implantation is carried out with ions of the semiconductor substrate body.

11. A process as claimed in claim 4, in which the implantation is carried out with particles which differ from the material of the semiconductor substrate body.

12. A process as claimed in claim 4, in which the region which is damaged in its lattice structure is produced by means of implantation through a covering layer.

13. A process as claimed in claim 4, in which the implantation energy is selected to be such that the region which is disturbed in its lattice structure lies at the surface of the semiconductor substrate body.

14. A process as claimed in claim 4, in which the implantation energy is selected to be such that the region which is disturbed in its lattice structure lies beneath the surface inside the semiconductor substrate body.

15. A process as claimed in claim 5, in which the diffusion process is split into a predeposition stage and a following drive-in stage.

16. A process as claimed in claim 15, in which the predeposition is carried out prior to the production of the region which is disturbed in its lattice structure.

17. A process as claimed in claim 15, in which the predeposition is carried out following the production of the region which is disturbed in its lattice structure.

* * * * *